(12) United States Patent
Huang et al.

(10) Patent No.: US 6,297,065 B1
(45) Date of Patent: Oct. 2, 2001

(54) METHOD TO REWORK DEVICE WITH FAULTY METAL STACK LAYER

(75) Inventors: Jiahua Huang; Pei-Yuan Gao, both of San Jose; Anne E. Sanderfer, Campbell, all of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/229,006

(22) Filed: Jan. 12, 1999

(51) Int. Cl.$^7$ .................................................. H01L 21/66
(52) U.S. Cl. .............................. 438/14; 438/631; 438/16; 438/18; 371/16.2; 371/23; 371/25.1; 371/68.1; 371/68.3
(58) Field of Search ................................ 438/631, 14, 16, 438/18, 597, 669, 622, 707, 709, 710; 364/578; 371/16.2, 23, 25.1, 68.1, 68.5

(56) References Cited

U.S. PATENT DOCUMENTS 5,475,624 * 12/1995 West ...................................... 364/578
5,767,006 * 6/1998 Lee ....................................... 438/597

* cited by examiner

Primary Examiner—David Nelms
Assistant Examiner—Reneé R. Berry
(74) Attorney, Agent, or Firm—H. Donald Nelson

(57) ABSTRACT

A method of manufacturing semiconductor wafers wherein a metal layer is formed on a surface of a layer of interlayer dielectric on a partially completed semiconductor wafer and if it is determined that the metal layer is faulty, the faulty metal layer is removed, the surface of the layer of interlayer dielectric is lowered below the tops of metal plugs formed in the layer of interlayer dielectric, the tops of the metal plugs are planarized to the surface of the layer of interlayer dielectric and the metal layer is reformed on the surface of the interlayer dielectric. If the metal layer is determined to be good, the metal layer is etched. If the metal etch is faulty, the metal layer is removed, the layer of interlayer dielectric is reduced to below the tops of plugs formed in the layer of interlayer dielectric, the tops of the metal plugs are planarized down to the surface of the layer of interlayer dielectric and the layer of metal is reformed.

4 Claims, 5 Drawing Sheets

METHOD TO REWORK DEVICE WITH FAULTY METAL STACK LAYER

BACKGROUND OF THE INVENTION

1. Field of the Invention

This invention relates generally to the manufacture of semiconductor wafers and more specifically, this invention relates to a method of reworking semiconductor wafers that have a faulty metal layer deposition process or a faulty metal layer etch process.

2. Discussion of the Related Art

The processes related to the deposition and etching of metal layers that are used for forming interconnections are at the backend of the semiconductor fabrication process and, as can be appreciated, the semiconductor wafers have almost reached their maximum value. As can be further appreciated, if the very last process fails, the entire wafer must be scrapped with the concomitant loss of the value of the wafer.

FIG. 1 is a flow diagram of the prior art method of manufacturing semiconductor wafers. The method of manufacturing semiconductor devices on semiconductor wafers starts as shown at 100. As is known in the semiconductor art, after a wafer is completely processed, the wafer is "diced," that is, cut into many chips. The future chips on the wafer are subjected to a series of processes as shown at 102 including forming active elements in a semiconductor substrate and forming a layer of an interlayer dielectric on the surface of the semiconductor substrate. As is known in the semiconductor manufacturing art, at least one metal layer is formed on the surface of the interlayer dielectric as shown at 104. The metal layer is etched to form electrical interconnects either between one portion of the semiconductor and including connections by vias to a layer underlying the metal layer or to a layer overlying the metal layer. The metal layer is also known as a metal stack because it is typically formed from several different layers of materials. For example, a first layer of material could be a barrier layer made of TiW/Ti, the next layer of material could be a layer of aluminum, the next layer of material could be an anti-reflective coating, typically, Ti/TiN and the last layer could be a hard mask layer made of TEOS. All of these materials are well known in the semiconductor manufacturing art as is the method of depositing them and will not be further discussed.

After the metal layer is formed at 104, the metal layer is checked at 106 before the wafer is sent to the next process. If the metal layer is not good, the wafer is scrapped as shown at 108. If the metal layer is good, the metal layer is etched, at 110. The quality of the metal etch is checked at 112 and if not good, the wafer is scrapped at 108. If the metal layer etch is good, it is determined at 114 if the metal process just completed is the last metal process and if not, the wafer is further processed as shown at 116. If the metal process just completed is the last metal process, the wafer is processed to completion, as shown at 118.

The processing of a semiconductor wafer is becoming more and more process intensive, that is, there are many more processes being incorporated into the overall manufacturing process as the wafers become more complex and as more metal layers become necessary. The amount of time and expense invested in each wafer increases as the overall manufacturing process nears completion, and as can be appreciated, when the last metal layer is being processed, the semiconductor wafer has almost reached its maximum value. The processes involving metal deposition and metal etching are becoming more and more critical because of the structural complexity of films used in metal depositions and the chemistry used in etching processes.

As discussed above, in the current manufacturing process, if the last metal layer fails, the wafer is scrapped with the entire investment in the wafer having to be amortized over the remaining wafers that are good. This amortization causes the price of the surviving wafers to be increased and depending upon economic forces in the marketplace, the profit margin to the semiconductor manufacturer is decreased and in some cases, there may be no profit margin at all.

Therefore, what is needed is a rework procedure to save the majority, if not all of the wafers that have faulty metal layers caused by faulty metal deposition or metal etch processes.

SUMMARY OF THE INVENTION

According to the present invention, the foregoing and other objects and advantages are obtained by a method of manufacturing semiconductor wafers wherein faulty metal layers and faulty metal etched layers are removed, the wafer refurbished and the metal layer reformed. In accordance with one aspect of the invention, the method involves determining if a metal layer formed on a layer of interlayer dielectric is faulty. If the metal layer is faulty, the faulty metal layer is removed, the surface of the layer of interlayer dielectric is lowered to below the tops of metal plugs formed in the layer of interlayer dielectric, the tops of the metal plugs are planarized to the surface of the layer of interlayer dielectric and the metal layer is reformed on the surface of the interlayer dielectric.

In accordance with another aspect of the invention, if the metal layer is determined to be good, the metal layer is etched. If the metal etch is determined to be faulty, the metal layer is removed, the layer of the interlayer dielectric is reduced to below the tops of plugs formed in the layer of interlayer dielectric, the tops of the metal plugs are planarized down to the surface of the layer of interlayer dielectric and the layer of metal is reformed.

In accordance with still another aspect of the invention, each successive metal layer is formed and determined to be good or faulty and each successive metal etch is determined to be good or faulty and if either are faulty, the faulty metal layer is removed, the semiconductor wafer refurbished and the metal layer reformed.

The described method of manufacturing semiconductor wafers thus provides a method of salvaging wafers that otherwise would be scrapped.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

FIGS. 3A–3E show the manufacturing steps for reworking a semiconductor wafer after a faulty metal deposition in accordance with the present invention, wherein;

FIG. 3A shows a partially completed semiconductor wafer showing a layer of a semiconductor substrate, a layer of interlayer dielectric with metal plugs or vias extending from the layer of the semiconductor substrate to a faulty metal stack overlying the layer of interlayer dielectric, wherein the faulty metal stack is determined after the metal stack has been deposited;

FIG. 3B shows the partially completed semiconductor device as shown in FIG. 3A with the faulty metal stack removed;

FIG. 3C shows the partially completed semiconductor device as shown in FIG. 3B after a process to lower the level of the dielectric below the top of the metal plugs;

FIG. 3D shows the partially completed semiconductor device as shown in FIG. 3C after a metal polish to planarize the metal plugs to the level of the dielectric;

FIG. 3E shows the partially completed semiconductor device as shown in FIG. 3D after the metal stack has been reformed on the surface of the layer of interlayer dielectric;

FIGS. 4A–4E show the manufacturing steps for reworking a semiconductor wafer after a faulty metal etch, wherein;

FIG. 4A shows a portion of a partially completed semiconductor device showing a layer of a semiconductor substrate, a layer of interlayer dielectric with metal plugs or vias extending from the layer of the semiconductor substrate to a faulty metal stack overlying the layer of interlayer dielectric, wherein the faulty metal stack is determined after the metal stack has been etched;

FIG. 4B shows the partially completed semiconductor device as shown in FIG. 4A with the faulty metal stack removed;

FIG. 4C shows the partially completed semiconductor device as shown in FIG. 4B after the layer of interlayer dielectric has been planarized;

FIG. 4D shows the partially completed semiconductor device as shown in FIG. 4C after a metal polish to planarize the metal plugs to the level of the dielectric, and FIG. 4E shows the partially completed semiconductor device as shown in FIG. 4D after the metal stack has been reformed on the surface of the layer of interlayer dielectric.

DETAILED DESCRIPTION

Reference is now made in detail to specific embodiments of the present invention that illustrate the best mode presently contemplated by the inventors for practicing the invention.

Figure 1:
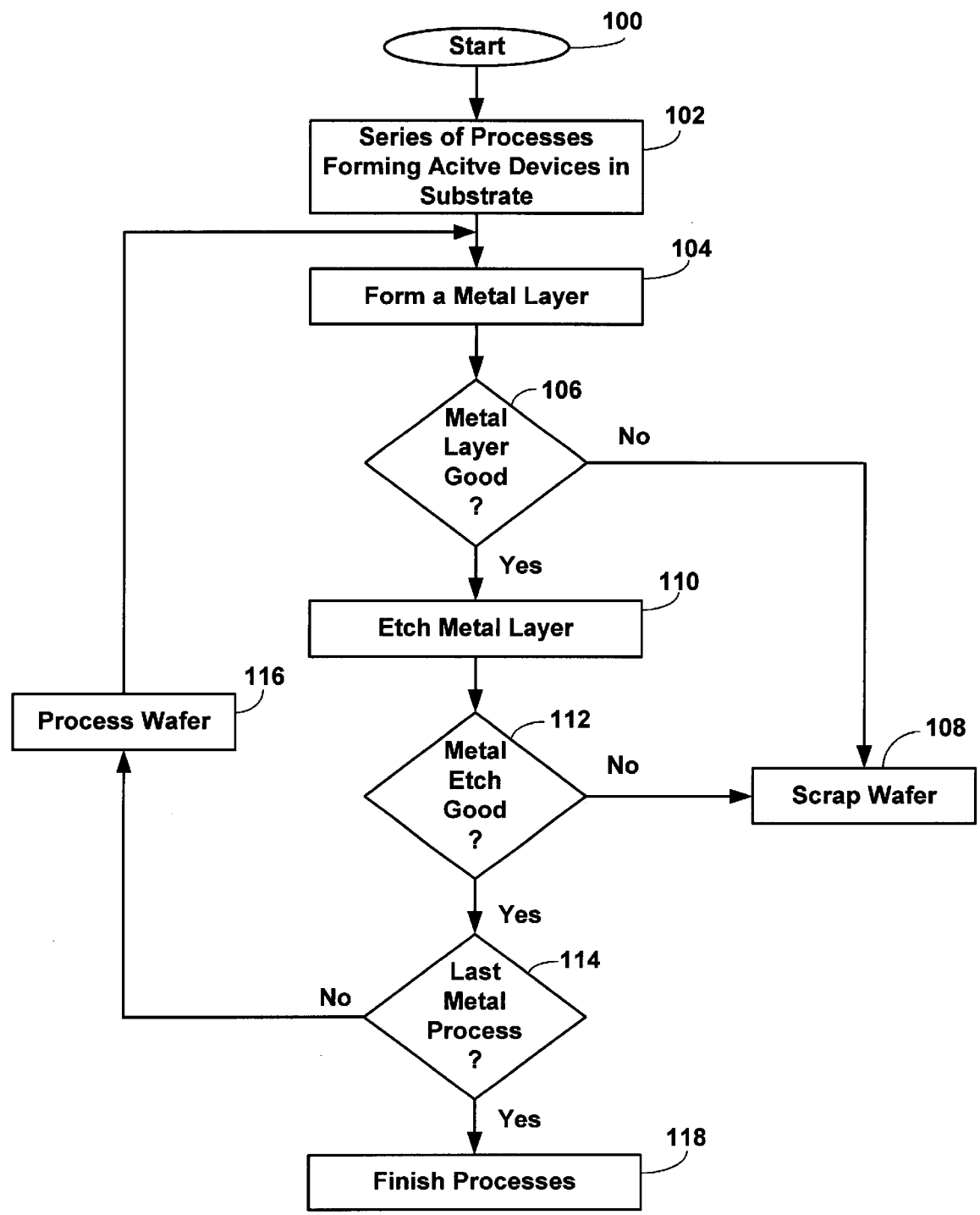
FIG. 1 is a flow diagram of the prior art method of manufacturing semiconductor wafers.
Figure 2:
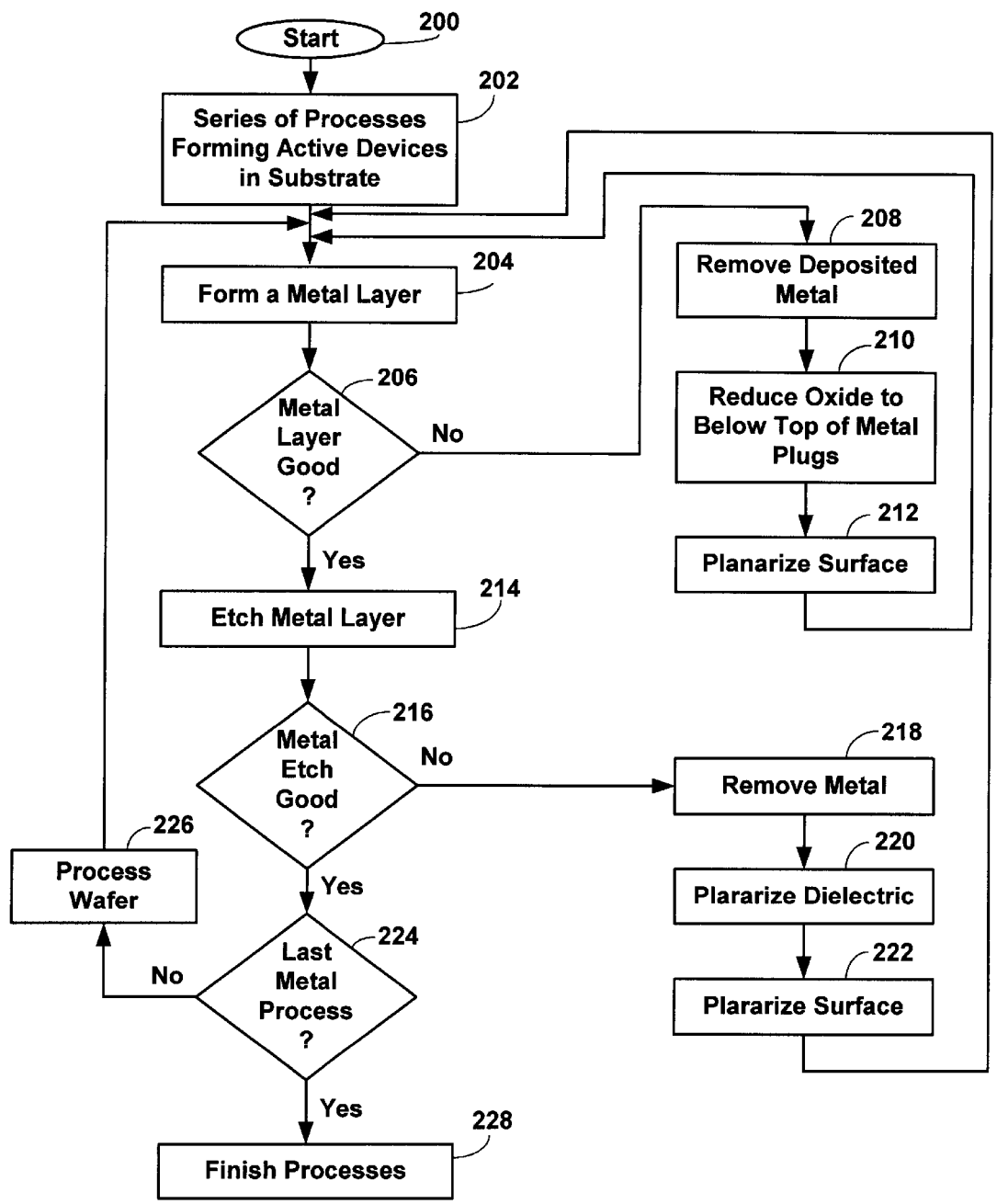
FIG. 2 is a flow diagram of a method of manufacturing semiconductor wafers in accordance with the present invention.

FIG. 2 is a flow diagram of a method of manufacturing semiconductor wafers in accordance with the present invention in which rework procedures are incorporated to salvage wafers that have a faulty metal layer deposition or a faulty metal layer etch process. The method of manufacturing semiconductor devices on semiconductor wafers starts as shown at 200. As discussed above, after a wafer is completely processed, the wafer is diced into many individual chips. The semiconductor wafer is subjected to a series of processes as shown at 202, including forming active elements in a semiconductor substrate and forming a layer of an interlayer dielectric on the surface of the semiconductor substrate. After the initial interlayer dielectric is formed on the semiconductor substrate, metal structures know as vias are formed in the initial layer of interlayer dielectric. The purpose of the vias is to electrically connect active elements in the semiconductor substrate to wires in a metal layer that communicate to other active elements in other portions of the semiconductor substrate or that communicate via bonding pads to external elements. The vias are connected to wires that are formed in the metal layer that is formed on the surface of the interlayer dielectric as indicated at 204. The metal layer is also known as a metal stack because it is typically formed from several different layers of materials. For example, a first layer of material could be a barrier layer made of TiW/Ti, the next layer of material could be a layer of aluminum, the next layer of material could be an anti-reflective coating, typically, Ti/TiN and the last layer could be a hard mask layer made of TEOS. All of these materials are well known in the semiconductor manufacturing art, as is the method of depositing them and will not be further discussed.

After the metal layer is formed at 204, the metal layer is checked at 206 before the wafer is sent to the next process. If the metal layer is not good, the wafer is reworked by first removing the faulty metal layer at 208, reducing the oxide making up the layer of interlayer dielectric at 210, planarizing the surface at 212 and returning the wafer to the process flow at 204. The reworking process steps are discussed in more detail below. If the metal layer is good at 206, the metal layer is etched at 214. The quality of the metal layer etch is checked at 216, and if not good, the wafer is reworked by first removing the faulty metal at 218, planarizing the layer of interlayer dielectric at 220, planarizing the metal plugs at 222, and the wafer is then returned to standard processing by reforming the metal layer at 204. If the quality of the metal layer etch is determined to be good at 216, it is determined at 224 if the metal layer process just performed is the last metal process. If it is not the last metal process, the wafer is further processed at 226 and the next metal layer is formed at 204 and the process just described is repeated. If it is determined at 224, that the metal layer process just performed is the last metal process, the wafer is processed to completion, as shown at 228.

FIGS. 3A–3E show the manufacturing steps for reworking a semiconductor wafer after a faulty metal layer deposition has been detected at 206 (FIG. 2).

Figure 3A:
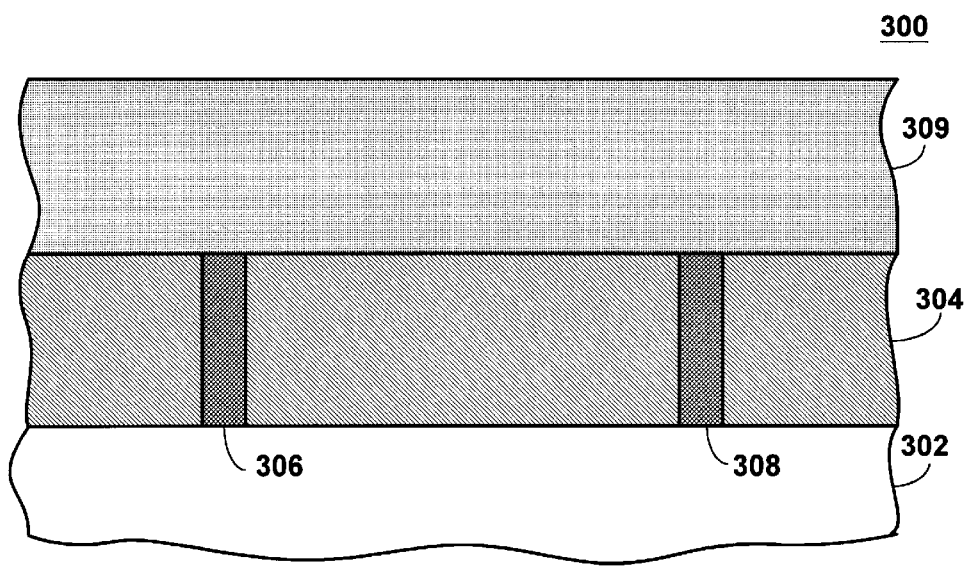

FIG. 3A shows a portion 300 of a partially completed semiconductor wafer showing a layer 302 that could be semiconductor substrate containing active devices (not shown). The layer 304 is a layer of interlayer dielectric showing two metal structures 306 and 308 that are also known as vias. The two vias 306 and 308 serve to electrically connect active elements (not shown) in the layer 302 with elements, such as wires or other vias, that will be formed in the metal layer 309. As discussed above, the metal layer 309 is also known as a metal stack because it is typically formed from several different layers of materials. For example, a first layer of material in the metal stack could be a barrier layer made of TiW/Ti, the next layer of material could be a layer of aluminum, the next layer of material could be an anti-reflective coating, typically, Ti/TiN and the last layer could be a hard mask layer made of TEOS. All of these materials are well known in the semiconductor manufacturing art, as is the method of depositing them and will not be further discussed.

Figure 3B:
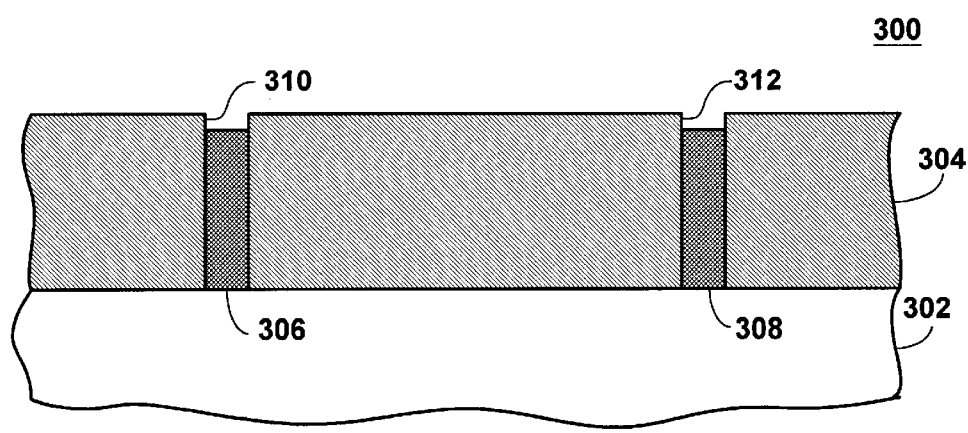

FIG. 3B shows the portion 300 of the partially completed semiconductor wafer as shown in FIG. 3A after a process to remove the faulty layer of metal 309. Because the process for removing the metal layer 309 is difficult to control precisely, the removal of the metal layer 309 causes the top surface of the metal making up the metal plugs in the vias 306 and 308 to be below the surface of the layer 304 of interlayer dielectric as indicated at 310 and 312.

Figure 3C:
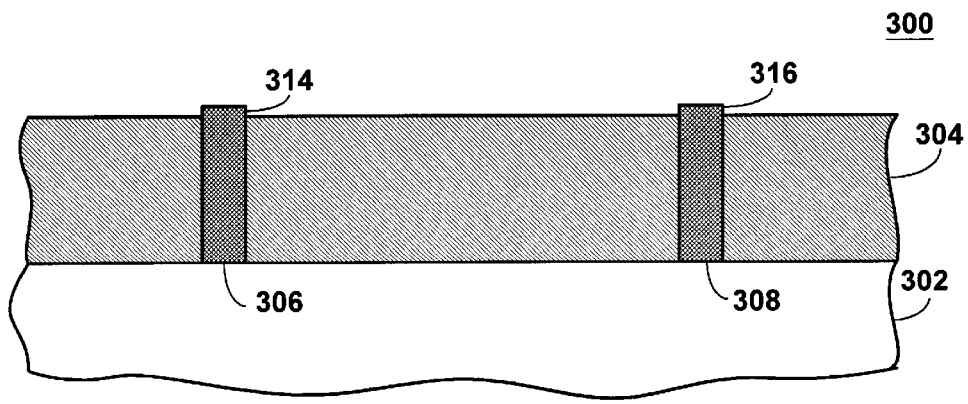

FIG. 3C shows the portion 300 of the partially completed semiconductor wafer as shown in FIG. 3B after a process to planarize the top surface of the layer 304 of interlayer dielectric to a level below the top surface of the metal plugs in the vias 306 and 308 as indicated at 314 and 316.

Figure 3D:
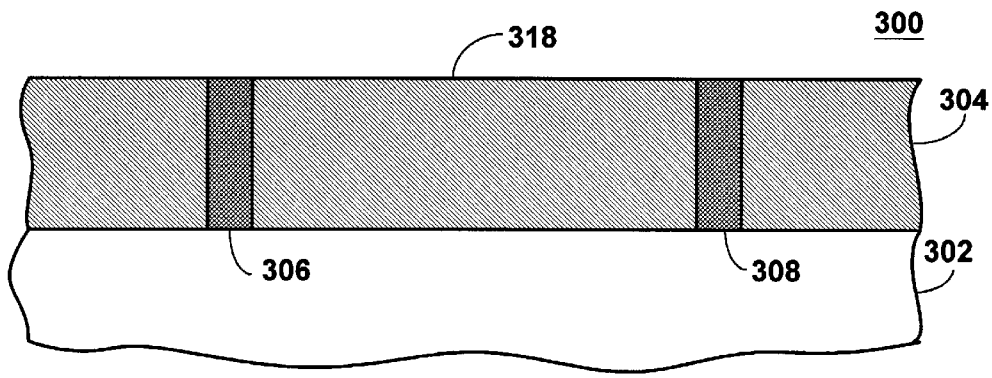

FIG. 3D shows the portion 300 of the partially completed semiconductor wafer as shown in FIG. 3C after a planarization process to planarize the protruding portions of the metal plugs in the vias 306 and 308 so that the top surface 318 of the semiconductor wafer is planarized.

Figure 3E:
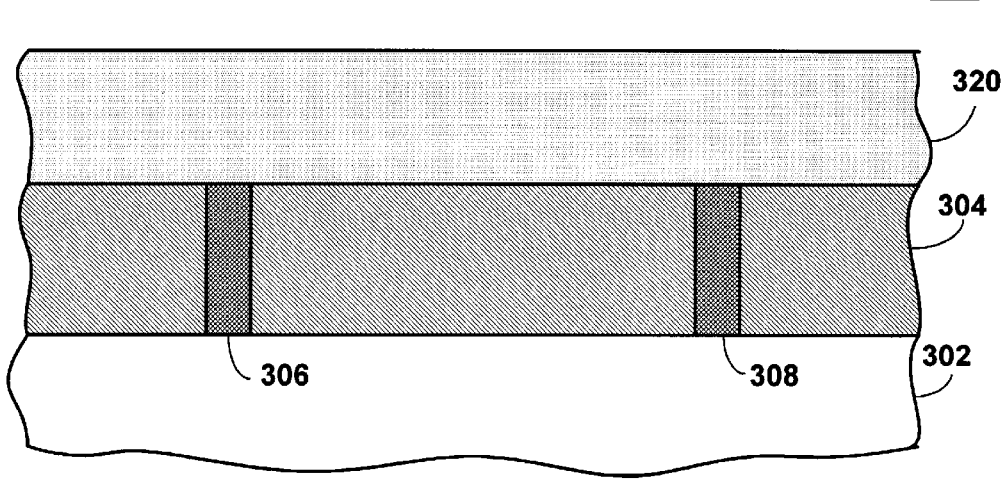

FIG. 3E shows the portion 300 of the partially completed semiconductor wafer as shown in FIG. 3D after a new metal layer 320 has been formed on the layer 304 of interlayer dielectric.

FIGS. 4A–4E show the manufacturing steps for reworking a semiconductor wafer after a faulty metal etch is detected at 216 (FIG. 2).

Figure 4A:
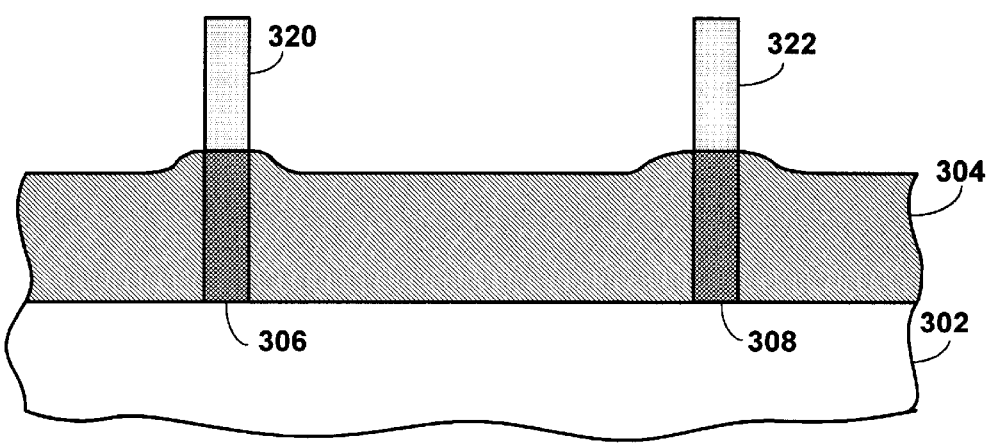

FIG. 4A shows the portion 300 of the partially completed semiconductor wafer as shown in FIG. 3E after a successful metal layer deposition but after a faulty metal etch process that has been detected at 216 (FIG. 2). The portion 300 includes the layer 302 of the semiconductor substrate, the layer 304 of interlayer dielectric with metal plugs filling the vias 306 and 308. Because the metal deposition process was good, the metal layer etch process was completed and results in the metal structures 320 and 322 having been formed. The metal structures 320 and 322 are shown as vias that are in contact with the vias 306 and 308. However, because the metal etch was determined to be faulty at 216 (FIG. 2), the partially completed semiconductor wafer must be reworked.

Figure 4B:
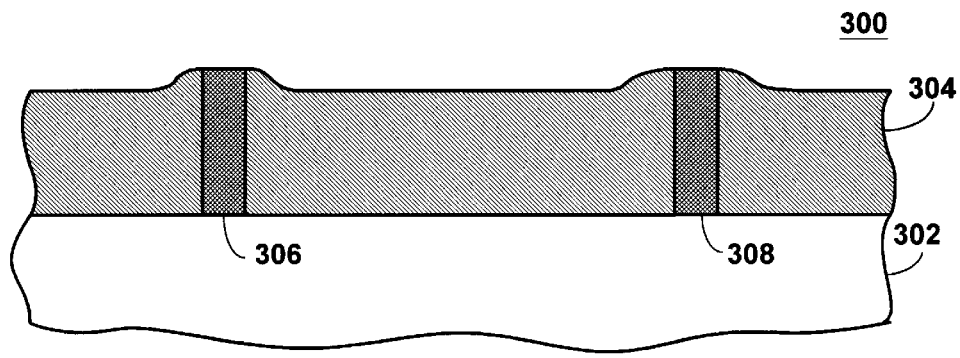

FIG. 4B shows the portion 300 of the partially completed semiconductor wafer as shown in FIG. 4A after a process to remove the faulty metal structures 320 and 322. A chemical mechanical polish (CMP) process is used to remove the faulty metal structures 320 and 322.

Figure 4C:
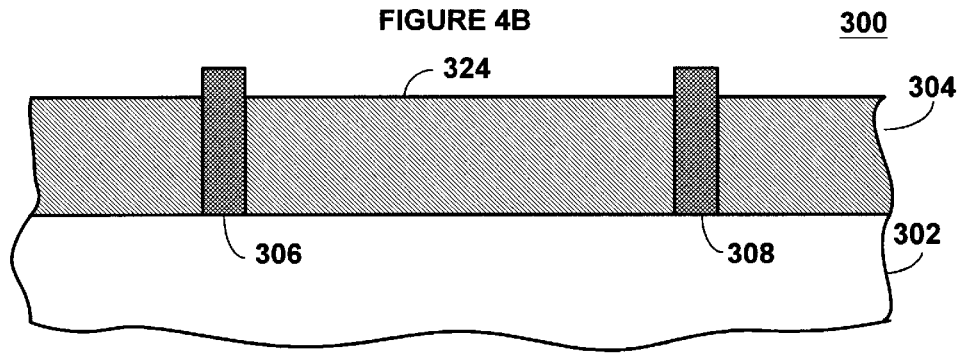

FIG. 4C shows the portion 300 of the partially completed semiconductor wafer as shown in FIG. 4B after a process to planarize the surface 324 of the layer 304 of interlayer dielectric.

Figure 4D:
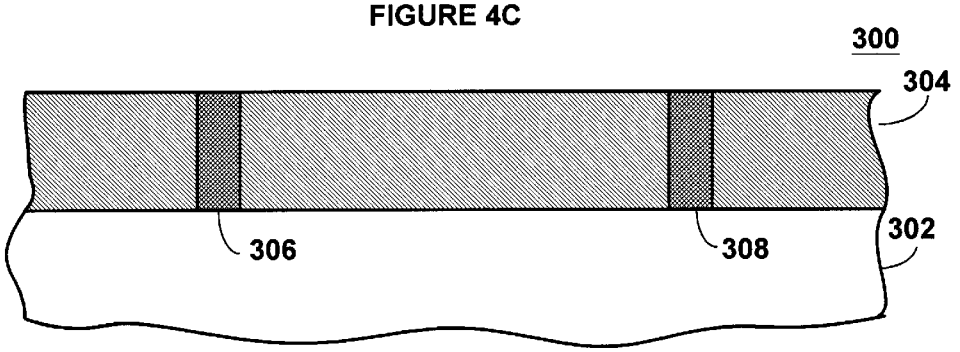

FIG. 4D shows the portion 300 of the partially completed semiconductor wafer as shown in FIG. 4C after a metal polish process to planarize protruding portions of the metal plugs in the vias 306 and 308 so that the top surface 324 of the semiconductor wafer is planarized.

Figure 4E:
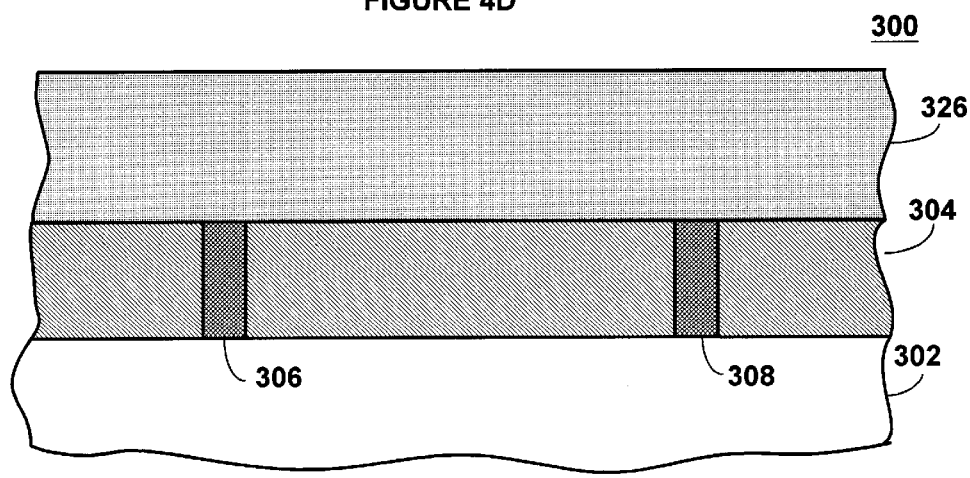

FIG. 4E shows the portion 300 of the partially completed semiconductor wafer as shown in FIG. 3D after a new metal layer 326 has been formed on the layer 304 of interlayer dielectric.

In summary, the results and advantages of the method of the present invention can now be more fully realized. The method of removing faulty layers of metal after metal deposition or after metal etch provides a method of salvaging wafers that otherwise would be scrapped.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing semiconductor wafers, the method comprising:

forming a metal layer on a surface of a layer of interlayer dielectric on a partially completed semiconductor wafer;

determining if the metal layer is faulty;

if the metal layer is determined to be faulty, removing the faulty metal layer from the surface of the layer of interlayer dielectric on the partially completed semiconductor wafer;

reducing the surface of the layer of interlayer dielectric below tops of metal plugs formed in the layer of interlayer dielectric;

planarizing the tops of the metal plugs and the surface of the layer of interlayer dielectric; and reforming a metal layer on the surface of the layer of interlayer dielectric on the partially completed semiconductor wafer.

2. The method of claim 1 further comprising:

etching the metal layer if the metal layer is good;

determining if the metal etch is faulty;

if the metal etch is determined to be faulty, removing the metal layer;

planarizing the layer of interlayer dielectric;

planarizing the tops of the metal plugs and the surface of the layer of interlayer dielectric; and reforming a metal layer on the surface of the layer of interlayer dielectric on the partially completed semiconductor wafer.

3. The method of claim 2 further comprising:

determining if the metal layer is the last metal layer to be formed if the metal etch is determined to be good;

further processing the partially completed semiconductor wafer if the metal layer is not the last layer to be formed on the partially completed semiconductor wafer;

forming a next metal layer on a surface of a next layer of interlayer dielectric;

determining if the next metal layer is faulty;

if the next metal layer is determined to be faulty, removing the faulty next metal layer from the surface of the next layer of interlayer dielectric;

reducing the surface of the next layer of interlayer dielectric below tops of metal plugs formed in the next layer of interlayer dielectric;

planarizing the tops of the metal plugs and the surface of the next layer of interlayer dielectric; and reforming a metal layer on the surface of the next layer of interlayer dielectric on the partially completed semiconductor wafer.

4. The method of claim 3 further comprising:

etching the next metal layer if the next metal layer is good;

determining if the next metal etch is faulty;

if the next metal etch is determined to be faulty, removing the next metal layer;

planarizing the next layer of interlayer dielectric;

planarizing tops of metal plugs formed in the next layer of interlayer dielectric and a surface of the next layer of interlayer dielectric;

reforming a next metal layer on the surface of the next layer of interlayer dielectric on the partially completed semiconductor wafer.

\* \* \* \* \*